United States Patent
Lin

(10) Patent No.: US 6,872,496 B2
(45) Date of Patent: Mar. 29, 2005

(54) $ALSI_xO_Y$ AS A NEW BI-LAYER HIGH TRANSMITTANCE ATTENUATING PHASE SHIFTING MASK MATERIAL FOR 193 NANOMETER LITHOGRAPHY

(75) Inventor: Cheng-Ming Lin, Yunlin (TW)

(73) Assignee: Taiwan Semiconductor Manufacturing Company, Hsinchu (TW)

( * ) Notice: Subject to any disclaimer, the term of this patent is extended or adjusted under 35 U.S.C. 154(b) by 107 days.

(21) Appl. No.: 10/284,964

(22) Filed: Oct. 31, 2002

(65) Prior Publication Data

US 2004/0086785 A1 May 6, 2004

(51) Int. Cl.[7] ............................. G03F 9/00; G03C 5/80
(52) U.S. Cl. ......................... 430/5; 430/322; 430/323; 430/324
(58) Field of Search ............................ 430/5, 322–324

(56) References Cited

U.S. PATENT DOCUMENTS

| | | | |
|---|---|---|---|
| 5,480,747 A | 1/1996 | Vasudev | 430/5 |
| 5,667,919 A | 9/1997 | Tu et al. | 430/5 |
| 5,714,285 A | 2/1998 | Tu et al. | 430/5 |
| 6,087,047 A | 7/2000 | Mitsui et al. | 430/5 |
| 6,150,058 A | 11/2000 | Tu et al. | 430/5 |
| 6,261,725 B1 | 7/2001 | Tzu et al. | 430/5 |
| 6,274,280 B1 * | 8/2001 | Carcia | 430/5 |
| 2003/0077520 A1 * | 4/2003 | Smith | 430/5 |

OTHER PUBLICATIONS

"Attenuated phase shift mask materials for 248 and 193 nm lithography," by B.W. Smith et al., J. Vac. Sci. Technol., B, vol. 14(6), pp. 3719–3723.

* cited by examiner

*Primary Examiner*—Geraldine Letscher
(74) *Attorney, Agent, or Firm*—Thomas, Kayden, Horstemeyer & Risley

(57) ABSTRACT

A bi-layer attenuating phase shifting film and method of forming the film are described. The bi-layer film has a first layer of $AlSi_{x1}O_{y1}$ and a second layer of $AlSi_{x2}O_{y2}$. The first layer of $AlSi_{x1}O_{y1}$ and the second layer of $AlSi_{x2}O_{y2}$ are both deposited by sputtering using a sputtering system an aluminum target, a silicon target, a source of oxygen gas, and a source of argon gas. The index of refraction, n, and the extinction coefficient, k, of the deposited films are controlled by controlling the direct current, DC, power to the aluminum target and by controlling the oxygen flow rate. The values of n and k are selected to produce a bi-layer film having a transmittance of between about 15% and 45% and good chemical stability. The phase shift of the bi-layer film is determined by the index of refraction, extinction coefficient, and thickness of each of the films.

29 Claims, 3 Drawing Sheets

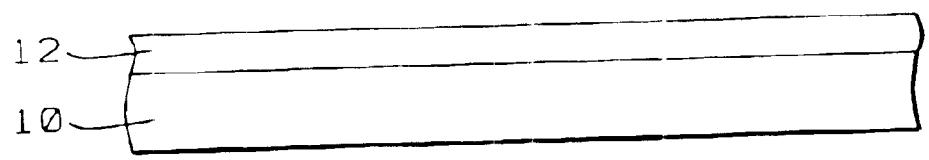
FIG. 1 - Prior Art
FIG. 2

ALSI$_x$O$_Y$ AS A NEW BI-LAYER HIGH TRANSMITTANCE ATTENUATING PHASE SHIFTING MASK MATERIAL FOR 193 NANOMETER LITHOGRAPHY

BACKGROUND OF THE INVENTION (1) Field of the Invention

This invention relates to a new bi-layer attenuating phase shifting material and method of forming the new bi-layer attenuating phase shifting material using two layers of AlSi$_x$O$_y$, wherein x may be different in each layer and y may be different in each layer. The new bi-layer material is particularly useful in 193 nanometer lithography.

(2) Description of the Related Art

Phase shifting materials and attenuating phase shifting materials are of considerable importance in the formation of phase shifting photomasks.

U.S. Pat. No. 6,150,058 to Tu et al. describes methods of making attenuating phase shifting masks using different exposure doses.

U.S. Pat. No. 6,087,047 to Mitsui et al. describes a half-tone phase shift mask blank.

U.S. Pat. No. 5,480,747 to Vasudev describes attenuated phase shifting masks with buried absorbers.

U.S. Pat. No. 6,261,725 B1 to Tzu et al. describes a method for modulating the phase angle of a phase shift mask used in deep ultra violet photolithography. The phase angle of the phase shift layer may be incrementally changed by chemical treatment.

U.S. Pat. No. 5,714,285 to Tu et al. describes the use of a composite of $(LaNiO_3)_x(TiO_2)_{1-x}$ to form attenuating phase shifting blanks and masks.

U.S. Pat. No. 5,667,919 to Tu et al. describes an attenuated phase shifting mask blank, an attenuated phase shifting mask blank, and methods used to form them. The attenuating phase shifting material is $Ta_xSi_yO_{1-x-y}$ tantalum-silicon oxide.

A paper entitled "Attenuated phase shift mask materials for 248 and 193 nm lithography", by B. W. Smith et al., J. Vac. Sci. Technol., B, Vol. 14(6), pages 3719–3723, November/December 1996 describes materials which may be used as attenuated phase shift mask films.

SUMMARY OF THE INVENTION

Attenuating phase shifting materials are of considerable importance in the formation of phase shifting photomasks. FIG. 1 shows a cross section view of a conventional attenuating phase shifting mask blank having a layer of attenuating phase shifting material 12 formed on a quartz substrate 10. As 193 nanometer lithography becomes more important it is important to have an attenuating phase shifting material which has an adequate transmittance, at least 15%, for light having a wavelength of 193 nanometers.

It is a principle objective of at least one embodiment of this invention to provide a method of forming an attenuating phase shifting material having a transmittance of at least 15% for light having a wavelength of 193 nanometers.

It is another principle objective of at least one embodiment of this invention to provide an attenuating phase shifting material having a transmittance of at least 15% for light having a wavelength of 193 nanometers.

These objectives are achieved by forming a bi-layer attenuating phase shifting material having a first layer of AlSi$_{x1}$O$_{y1}$ and a second layer of AlSi$_{x2}$O$_{y2}$. The values of x1 and x2 may be the same but typically are different. The values of y1 and y2 may be the same but typically are different. The first layer of AlSi$_{x1}$O$_{y1}$ and the second layer of AlSi$_{x2}$O$_{y2}$ are both deposited by sputtering. The sputter deposition is accomplished in a sputtering chamber having an aluminum target, a silicon target, a source of oxygen gas, and a source of argon gas. The index of refraction, n, and the extinction coefficient, k, of the deposited films are controlled by controlling the direct current, DC, power to the aluminum target and by controlling the oxygen flow.

The resulting bi-layer film has a transmittance of between about 15% and 45% and has good chemical stability. The phase shift of the bi-layer film can be controlled by control of the index of refraction, extinction coefficient, and thickness of each of the films.

BRIEF DESCRIPTION OF THE DRAWINGS

FIG. 1 shows a cross section of a conventional attenuating phase shifting mask blank having a layer of attenuating phase shifting material formed on a layer of quartz.

FIG. 2 shows a cross section view of the bi-layer attenuating phase shifting material of this invention formed on a substrate.

DESCRIPTION OF THE PREFERRED EMBODIMENTS

Figure 3:
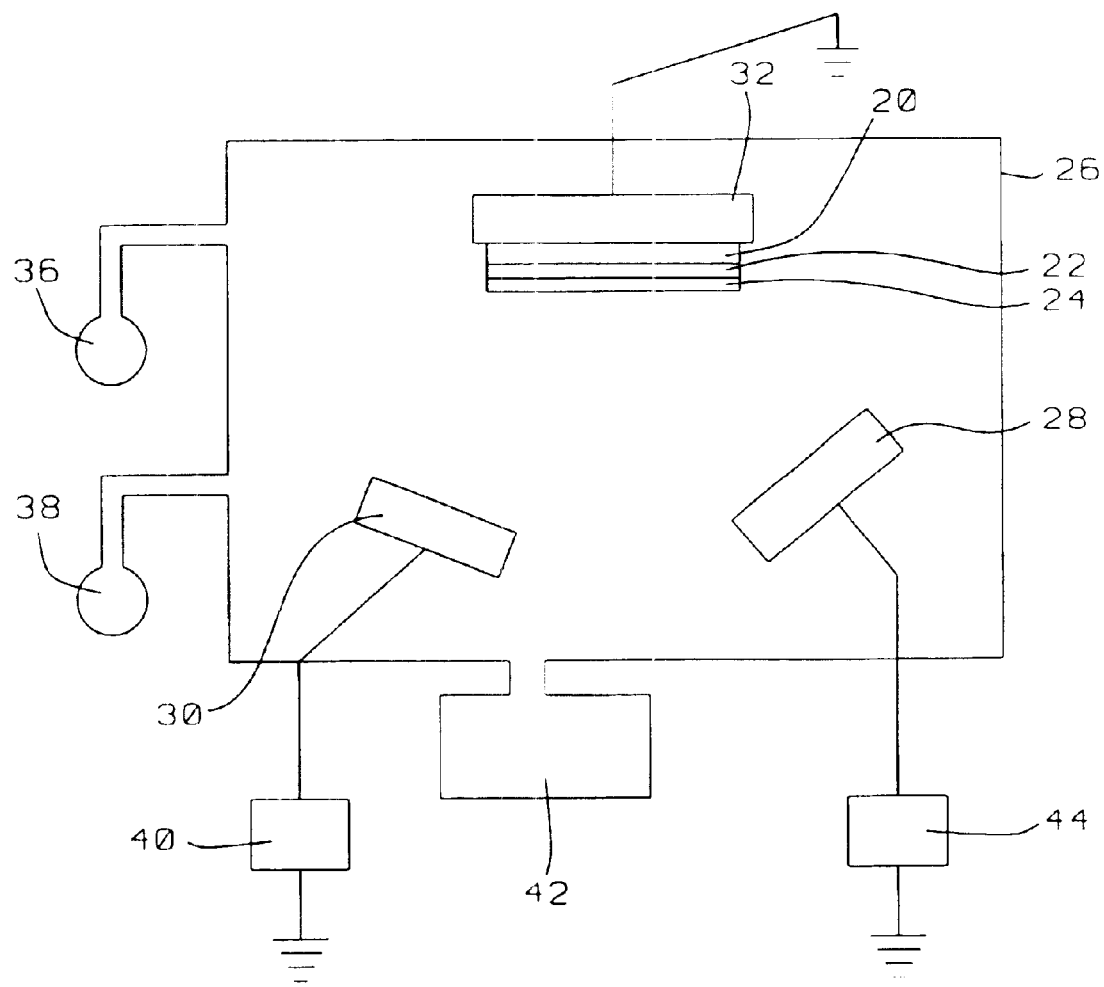
FIG. 3 shows a schematic view of a sputtering system used to form the bi-layer attenuating phase shifting material of this invention.

Refer now to FIGS. 2–5 for a detailed description of the method of this invention for forming a bi-layer attenuating phase shifting film of this invention and the bi-layer attenuating, or semi-transparent, phase shifting film of this invention. FIG. 2 shows a cross section view of the bi-layer attenuating, or semi-transparent, phase shifting film of this invention formed on a substrate 20. The bi-layer film has a first thickness 21 of a layer of first attenuating phase shifting material 22 formed on the substrate 20 and a second thickness 23 of a layer of second attenuating phase shifting material 24 formed on the first layer of first attenuating phase shifting material 22. The first attenuating phase shifting material is AlSi$_{x1}$O$_{y1}$. The second attenuating phase shifting material is AlSi$_{x2}$O$_{y2}$. In these films typically, but not necessarily, x1, x2, y1, and y2 are different. As an example for a film of this invention x1 is between about 0.38 and 0.52, x2 is between about 0.18 and 0.29, y1 is between about 0.48 and 0.66, and y2 is between about 1.02 and 1.17.

In the description of this invention attenuating phase shifting layer will be used to describe a semi-transparent phase shifting layer.

The films are formed by sputtering using a system having an aluminum target, a silicon target, a source of oxygen gas, and a source of argon gas. The index of refraction, the real part of the complex index of refraction and the extinction coefficient, the imaginary part of the complex index of refraction, can be controlled by control of the direct current, DC, power to the aluminum target and the oxygen flow rate. The transmittance and phase shift are adjusted by adjusting the index of refraction, the extinction coefficient, the first thickness 21, and the second thickness 23. The bi-layer attenuating phase shifting film of this invention is typically used with light having a wavelength of 193 nanometers.

FIG. 3 shows a schematic diagram of a sputtering system used to deposit the attenuating phase shifting films of $AlSi_{x1}O_{y1}$ and $AlSi_{x2}O_{y2}$. The sputtering system is in a sputtering chamber 26 which contains an aluminum target 30 and a silicon target 28. The substrate 20 on which the films are to be deposited is held by a substrate holder 32 which is connected to ground potential. A first direct current, DC, power supply 40 is connected between the aluminum target 30 and ground potential. A second radio frequency, RF, power supply 44 is connected between the silicon target 28 and ground. A vacuum pump 42 is connected to the sputtering chamber 26 and is used to control the pressure in the chamber 26. A source of oxygen gas 36 and a source of argon gas 30 are connected to the chamber.

First the layer of first attenuating phase shifting material 22, $AlSi_{x1}O_{y1}$, is deposited on the substrate 20 to a first thickness 21 using a first DC power supplied to the aluminum target, a second RF power supplied to the silicon target, oxygen flowing into the chamber from the source of oxygen gas 36 at a first flow rate, and argon flowing into the chamber from the source of argon gas at a second flow rate. Next the layer of second attenuating phase shifting material 24, $AlSi_{x2}O_{y2}$, is deposited on the layer of first attenuating phase shifting material 22 to a second thickness 23 using a third DC power supplied to the aluminum target, a fourth RF power supplied to the silicon target, oxygen flowing into the chamber from the source of oxygen gas 36 at a third flow rate, and argon flowing into the chamber from the source of argon gas at a fourth flow rate. The first and third DC power levels and the first and third flow rates are adjusted to provide the desired optical properties in the bi-level film as will now be described.

Figure 4:
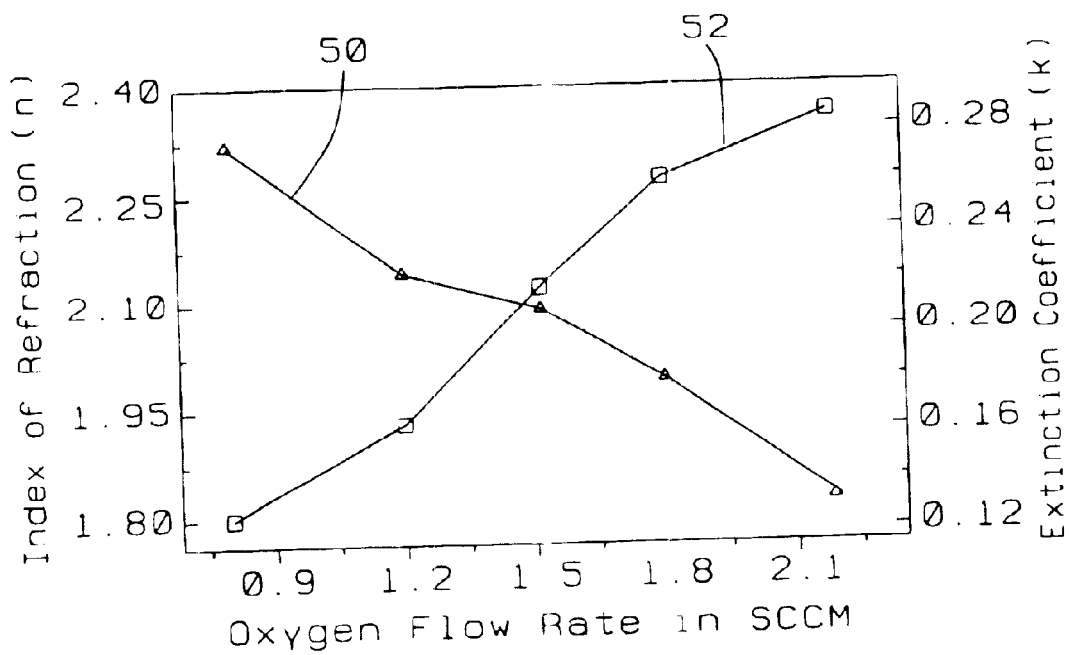
FIG. 4 shows curves of the index of refraction, n, and the extinction coefficient, k, as a function of oxygen flow rate.

FIG. 4 shows the dependence of the index of refraction, n, and extinction coefficient, k, of a layer of sputtered $AlSi_xO_y$ on the oxygen flow rate in standard cubic centimeters per minute, sccm. Reference number 50 indicates the curve of extinction coefficient as a function of oxygen flow rate indicating a decreasing extinction coefficient with increasing oxygen flow rate. Reference number 52 indicates the curve of index of refraction as a function of oxygen flow rate indicating an increasing index of refraction with increasing oxygen flow rate. These curves show that, for a range of oxygen flow rate of between about 0.8 and 2.2 sccm, the index of refraction varies between about 1.8 and 2.35 and the extinction coefficient varies between about 0.12 and 0.29 for a DC power supplied to the aluminum target of about 160 watts, a RF power supplied to the silicon target of about 70 watts, and an argon flow rate of about 86 sccm.

Figure 5:
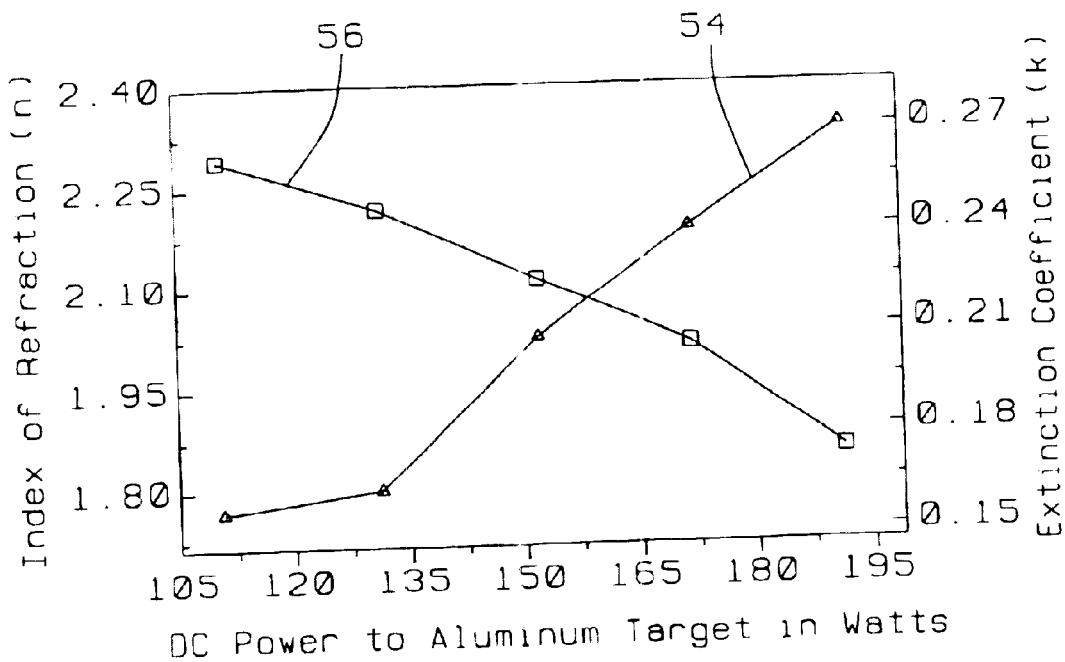
FIG. 5 shows curves of the index of refraction, n, and the extinction coefficient, k, as a function of DC power to the Aluminum target.

FIG. 5 shows the dependence of the index of refraction, n, and extinction coefficient, k, of a layer of sputtered $AlSi_xO_y$ on the DC power supplied to the aluminum target. Reference number 54 indicates the curve of extinction coefficient as a function of the DC power supplied to the aluminum target indicating an increasing extinction coefficient with increasing DC power to the aluminum target. Reference number 56 indicates the curve of index of refraction as a function of DC power supplied to the aluminum target indicating a decreasing index of refraction with an increasing DC power to the aluminum target. These curves show that, for a range of DC power to the aluminum target of between about 100 and 200 watts, the index of refraction varies between about 1.7 and 2.4 and the extinction coefficient varies between about 0.17 and 0.27 for an oxygen flow rate of about 1.5 sccm, a RF power supplied to the silicon target of about 70 watts, and an argon flow rate of about 86 sccm.

The oxygen flow rate and DC power to the aluminum target are varied to produce the index of refraction, n, and extinction coefficient, k, for the layer of first attenuating phase shifting material 22, $AlSi_{x1}O_{y1}$, which will provide a layer of first attenuating phase shifting material 22 having a transmittance of between about 5% and 35%. The oxygen flow rate and DC power to the aluminum target are varied to produce the desired index of refraction, n, and extinction coefficient, k, for the layer of second attenuating phase shifting material 24, $AlSi_{x2}O_{y2}$, which will provide a layer of second attenuating phase shifting material 24 having a transmittance of between about 20 and 60%. This will provide a combined layer of first attenuating phase shifting material 22, $AlSi_{x1}O_{y1}$, and layer of second attenuating phase shifting material 24, $AlSi_{x2}O_{y2}$, having a transmittance of between about 15% and 45% for light having a wavelength of 193 nanometers, see FIG. 3. The RF power to the silicon target and the argon flow rate are not critical during these depositions. As an example the RF power to the silicon target can be between about 60 and 80 watts and the argon flow rate can be between about 75 and 100 sccm.

The first thickness 21 of the layer of first attenuating phase shifting material 22 and the second thickness 23 of the layer of second attenuating phase shifting material 24 are then adjusted to provide the desired phase shift of 180° for light having a wavelength of 193 nanometers, see FIG. 2, for the combined layer of first attenuating phase shifting material and layer of second attenuating phase shifting material. In this example x1 is between about 0.38 and 0.52, x2 is between about 0.18 and 0.29, y1 is between about 0.48 and 0.66, and y2 is between about 1.02 and 1.17. In this example the first thickness 21 and second thickness 23 are each between about 24 and 60 Angstroms.

While the invention has been particularly shown and described with reference to the preferred embodiments thereof, it will be understood by those skilled in the art that various changes in form and details may be made without departing from the spirit and scope of the invention.

What is claimed is:

1. A method of forming a bi-layer attenuating phase shifting mask blank, comprising:

providing a transparent substrate;

forming a first thickness of a first aluminum-silicon oxide blanket attenuating phase shifting layer on said transparent substrate, wherein said first aluminum-silicon oxide blanket attenuating phase shifting layer has a formula of $AlSi_{x1}O_{y1}$; and forming a second thickness of a second aluminum-silicon oxide blanket attenuating phase shifting layer on said first aluminum-silicon oxide blanket attenuating phase shifting layer, wherein said second aluminum-silicon oxide blanket attenuating phase shifting layer has a formula of $AlSi_{x2}O_{y2}$.

2. The method of claim 1 wherein x1 is between about 0.38 and 0.52 and y1 is between about 0.48 and 0.66.

3. The method of claim 1 wherein x2 is between about 0.18 and 0.29 and y2 is between about 1.02 and 1.17.

4. The method of claim 1 wherein the transmittance of said first aluminum-silicon oxide blanket attenuating phase shifting layer is between about 5% and 35%.

5. The method of claim 1 wherein the transmittance of said second aluminum-silicon oxide blanket attenuating phase shifting layer is between about 20% and 60%.

6. The method of claim 1 wherein the transmittance of said transparent substrate, said first thickness of said first aluminum-silicon oxide blanket attenuating phase shifting layer formed on said transparent substrate, and said second thickness of said second aluminum-silicon oxide blanket attenuating phase shifting layer formed on said first aluminum-silicon oxide blanket attenuating phase shifting layer is between about 15% and 45%.

7. The method of claim 1 wherein the combination of said second thickness of said second aluminum-silicon oxide blanket attenuating phase shifting layer formed on said first thickness of said first aluminum-silicon oxide blanket attenuating phase shifting layer provides a phase shift of 180.degree.

8. The method of claim 1 wherein said first thickness is between about 24 and 60 Angstroms.

9. The method of claim 1 wherein said second thickness is between about 24 and 60 Angstroms.

10. The method of claim 1 wherein said first aluminum-silicon oxide blanket attenuating phase shifting layer and said second aluminum-silicon oxide blanket attenuating phase shifting layer are each formed using sputter deposition in a sputter chamber comprising an aluminum target, a silicon target, a direct current power supplied to said silicon target, oxygen gas supplied to said sputtering chamber at a first flow rate, and argon gas supplied to said sputtering chamber at a second flow rate.

11. The method of claim 10 wherein said direct current power is between about 100 and 200 watts.

12. The method of claim 10 wherein said first flow rate is between about 0.8 and 2.2 standard cubic centimeters per minute.

13. The method of claim 1 wherein said first thickness of said first aluminum-silicon oxide blanket attenuating phase shifting layer has an index of refraction of between about 1.5 and 2.6.

14. The method of claim 1 wherein said second thickness of said second aluminum-silicon oxide blanket attenuating phase shifting layer has an index of refraction of between about 1.5 and 2.6.

15. The method of claim 1 wherein said first thickness of said first aluminum-silicon oxide blanket attenuating phase shifting layer has an extinction coefficient of between about 0.11 and 0.41.

16. The method of claim 1 wherein said second thickness of said second aluminum-silicon oxide blanket attenuating phase shifting layer has an extinction coefficient of between about 0.11 and 0.41.

17. A bi-layer attenuating phase shifting mask blank, comprising:
 a transparent substrate;
 a first thickness of a first aluminum-silicon oxide blanket attenuating phase shifting layer formed on said transparent substrate, wherein said first aluminum-silicon oxide blanket attenuating phase shifting layer has a formula of $AlSi_{x1}O_{y1}$; and
 a second thickness of a second aluminum-silicon oxide blanket attenuating phase shifting layer formed on said first aluminum-silicon oxide blanket attenuating phase shifting layer, wherein said second aluminum-silicon oxide blanket attenuating phase shifting layer has a formula of $AlSi_{x2}O_{y2}$.

18. The bi-layer attenuating phase shifting mask blank of claim 17 wherein x1 is between about 0.38 and 0.52 and y1 is between about 0.48 and 0.66.

19. The bi-layer attenuating phase shifting mask blank of claim 17 wherein x2 is between about 0.18 and 0.29 and y2 is between about 1.02 and 1.17.

20. The hi-layer attenuating phase shifting mask blank of claim 17 wherein the transmittance of said first aluminum-silicon oxide blanket attenuating phase shifting layer is between about 5% and 35%.

21. The bi-layer attenuating phase shifting mask blank of claim 17 wherein the transmittance of said second aluminum-silicon oxide blanket attenuating phase shifting layer is between about 20% and 60%.

22. The bi-layer attenuating phase shifting mask blank of claim 17 wherein the transmittance of said transparent substrate, said first thickness of said first aluminum-silicon oxide blanket attenuating phase shifting layer formed on said transparent substrate, and said second thickness of said second aluminum-silicon oxide blanket attenuating phase shifting layer formed on said first aluminum-silicon oxide blanket attenuating phase shifting layer is between about 15% and 45%.

23. The bi-layer attenuating phase shifting mask blank of claim 17 wherein the combination of said second thickness of said second aluminum-silicon oxide blanket attenuating phase shifting layer formed on said first thickness of said first aluminum-silicon oxide blanket attenuating phase shifting layer provides a phase shift of 180.degree.

24. The bi-layer attenuating phase shifting mask blank of claim 17 wherein said first thickness is between about 24 and 60 Angstroms.

25. The bi-layer attenuating phase shifting mask blank of claim 17 wherein said second thickness is between about 24 and 60 Angstroms.

26. The bi-layer attenuating phase shifting mask blank of claim 17 wherein said first thickness of said first aluminum-silicon oxide blanket attenuating phase shifting layer has an index of refraction of between about 1.5 and 2.6.

27. The bi-layer attenuating phase shifting mask blank of claim 17 wherein said second thickness of said second aluminum-silicon oxide blanket attenuating phase shifting layer has an index of refraction of between about 1.5 and 2.6.

28. The bi-layer attenuating phase shifting mask blank of claim 17 wherein said first thickness of said first aluminum-silicon oxide blanket attenuating phase shifting layer has an extinction coefficient of between about 0.11 and 0.41.

29. The bi-layer attenuating phase shifting mask blank of claim 17 wherein said second thickness of said second aluminum-silicon oxide blanket attenuating phase shifting layer has an extinction coefficient of between about 0.11 and 0.41.

* * * * *